(12) United States Patent
Chang et al.

(10) Patent No.: US 6,562,691 B2
(45) Date of Patent: May 13, 2003

(54) METHOD FOR FORMING PROTRUSIVE ALIGNMENT-MARK

(75) Inventors: Ching-Yu Chang, I Lan Hsien (TW); Wei-Hwa Sheu, Hsinchu (TW)

(73) Assignee: Macronix International Co., Ltd. (TW)

(*) Notice: Subject to any disclaimer, the term of this patent is extended or adjusted under 35 U.S.C. 154(b) by 24 days.

(21) Appl. No.: 09/799,003

(22) Filed: Mar. 6, 2001

(65) Prior Publication Data

US 2002/0127815 A1 Sep. 12, 2002

(51) Int. Cl.$^7$ ................................................ H01L 21/76
(52) U.S. Cl. ...................... 438/401; 438/16; 438/692; 438/975
(58) Field of Search .......................... 438/401, 16, 692, 438/975, FOR 142, FOR 435; 257/792

(56) References Cited

U.S. PATENT DOCUMENTS

| | | | | |
|---|---|---|---|---|
| 5,429,956 A | * | 7/1995 | Shell et al. | 438/291 |
| 5,858,854 A | * | 1/1999 | Tsai et al. | 438/401 |
| 5,981,150 A | * | 11/1999 | Aoki et al. | 430/322 |
| 6,037,236 A | * | 3/2000 | Jang | 438/401 |
| 6,060,366 A | * | 5/2000 | Hong | 438/397 |
| 6,080,659 A | * | 6/2000 | Chen et al. | 438/401 |
| 6,136,662 A | * | 10/2000 | Allman et al. | 438/401 |
| 6,232,200 B1 | * | 5/2001 | Chu | 438/401 |
| 6,285,061 B1 | * | 9/2001 | Shell et al. | 257/344 |
| 6,288,454 B1 | * | 9/2001 | Allman et al. | 257/623 |
| 6,303,458 B1 | * | 10/2001 | Zhang et al. | 438/401 |
| 6,326,278 B1 | * | 12/2001 | Komuro | 438/401 |
| 6,346,456 B2 | * | 2/2002 | Chen | 438/401 |
| 6,417,073 B2 | * | 7/2002 | Watanabe | 438/424 |

* cited by examiner

Primary Examiner—George Fourson
Assistant Examiner—Michelle Estrada

(57) ABSTRACT

A method for forming a protrusive alignment-mark in semiconductor devices is disclosed. A photolithography process is performed to form a photoresist layer on a substrate wherein the substrate has an element region and an alignment region, and the photoresist layer has an element photoresist region and an alignment photoresist region. Afterwards, a first dielectric layer is deposited on the element photoresist region and the alignment photoresist region. The excess portion of first dielectric layer above the photoresist layer is removed such that the photoresist layer is coplanar with the first dielectric layer and thus the photoresist layer is exposed. The photoresist layer on the element region and said alignment region is stripped to form a protrusive alignment-mark on the alignment region.

25 Claims, 4 Drawing Sheets

METHOD FOR FORMING PROTRUSIVE ALIGNMENT-MARK

FIELD OF THE INVENTION

The present invention generally relates to a method for manufacturing semiconductor devices, and more particularly, to a method for forming a protrusive alignment-mark in semiconductor devices.

BACKGROUND OF THE INVENTION

With the rapid developments of semiconductor industry, the dimensions of integrated circuits (ICs) are largely scaled down into sub-micron level such that photolithography techniques therefore play an important role in semiconductor process, particularly, such as an alignment-mark for calibration. Usually, the alignment is exactly used for the adjustment of wafer orientation. While the position of the alignment-mark may be incorrect or indefinite during semiconductor process, the alignment-mark can not be a reference coordinates of an alignment so that the later processes, even yield rate, are severely influenced. Mostly, an alignment-mark, traditionally groove patterns, is formed by etching to be on some unused regions of wafer.

Additionally, during a process of multilevel interconnects, an alignment procedure is served as an alignment between layers wherein a specific area of a layer is settled with an alignment-mark. The alignment device using alignment-mark among layers is named as a stepper. In the alignment interval, the stepper may automatically adjusts the wafer orientation into correct position by using the alignment-mark as a reference coordinates such that each of layer is accurately aligned to others. When adjusting the wafer position, the stepper emits some specific wavelengths of light through layers, generating interference waves and being transferred into electronic signal, to determine whether the layers is correctly aligned or not. The conventional process, which comprising alignment area and element area, to fabricate a recess alignment-mark is shown in FIGS. 1–6.

Referring to FIG. 1, a recess alignment-mark 12 having a width of 8 µm, and a depth of 0.12 µm, is conventionally etched on an alignment area 14 inside a substrate 10.

Referring to FIG. 2, a borophosphosilicate (BPSG) layer is formed on the recess alignment-mark 12 and the element area 16.

Referring to FIG. 3, an etching process is carried out to remove the borophosphosilicate (BPSG) layer on the recess alignment-mark 12 and the element area 16, and then a contact hole 30 is formed on the element area 16.

Referring to FIG. 4, a tungsten layer deposited on the recess alignment-mark 12 and the element area 16 has a thickness of 4000 angstroms and a step height 42.

Referring to FIG. 5, the element area 16 is planarized by a chemical-mechanical polishing (CMP). When the tungsten layer on the element area 16 is removed totally and thus a tungsten plug is simultaneously formed thereof. Finally, referring FIG. 6, the aluminum layer 60 is deposited on the recess alignment-mark 12 and the element area 16.

In accordance with the foregoing, the conventional recess alignment-mark 12 is etched on the substrate 10, but the depth of the recess alignment-mark 12 can't adequately generate the interference weaves for alignment detection since the depth of the recess alignment-mark 12 is too shallow, merely 0.10 µm or the less. Further, if a protrusive alignment-mark is formed by an etching step, thereby a great thickness of dielectric layer must be deposited before the formation of the protrusive alignment-mark. However, the thickness range of alignment area 14 is too small, therefore, a large portion of dielectric layer needs to be etched away resulting in a waste of manufacturing cost. As a result, an etching step on the substrate is quite improper for forming a recess alignment-mark 12.

Furthermore, in the period of CMP process, a portion of recess alignment-mark 12 will be vanished so that a zero step height 42a is formed on element area. In other words, a wavelength difference can't be detected leading to alignment failure of wafer or dies.

Consequently, the conventional recess alignment-mark 12 formed by etching is not able to an adequate depth of recess alignment-mark 12 so that the recess alignment-mark 12 having a zero step height 42a, which cause the alignment failure in lithography, after the CMP process.

SUMMARY OF THE INVENTION

In view of the problems encountered with the foregoing conventional alignment-mark wherein these problems includes the insufficient of etching depth and the disappearance of step height with respect to the alignment-mark.

As a result, the primary object of the present invention is to provide a method of forming a protrusive alignment-mark having a step height for signal detection.

Another object of the present invention is to determine a fitting thickness of the protrusive alignment-mark by precisely control the thickness of the photoresist layer.

Still another object of the present invention is that the photoresist layer can be removed away to prevent the element area from contaminant after forming the protrusive alignment-mark.

According to the above objects, the present invention sets forth a method of forming a protrusive alignment-mark. A photolithography process is performed to form a patterned photoresist layer on a substrate wherein the substrate has an element region and an alignment region, and the patterned photoresist layer has an element photoresist-patterned region and an alignment photoresist-patterned region. Afterwards, a first dielectric layer is deposited on the element photoresist-patterned region and the alignment photoresist-patterned region. The excess portion of first dielectric layer above the patterned photoresist layer is removed such that the patterned photoresist layer is coplanar with the first dielectric layer and thus the patterned photoresist layer is exposed. The patterned photoresist layer on the element region and said alignment region is stripped to form a protrusive alignment-mark on the alignment region.

Thereafter, a second dielectric layer is formed on the protrusive alignment-mark and element region, and thereby retaining a step height of the protrusive alignment-mark. An etching process with respect to the element region and the alignment region is employed to remove the second dielectric layer on the protrusive alignment-mark, and etching a contact hole on the element region. A first conductive layer is formed on the protrusive alignment-mark and the element region. A planarization process is employed to planarize the element region to retain the step height of the protrusive alignment-mark all the time. A second conductive layer is formed on the protrusive alignment-mark and the element region for multilevel interconnects.

In summary, the present invention is to provide a method of forming a protrusive alignment-mark having a step height for signal detection after a CMP process. Additionally, the protrusive alignment-mark is suitable for mask ROM, DRAM, flash RAM and logic elements in the alignment procedure of semiconductor process. Most importantly, the thickness of protrusive alignment-mark is constructed by controlling the thickness of photoresist layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
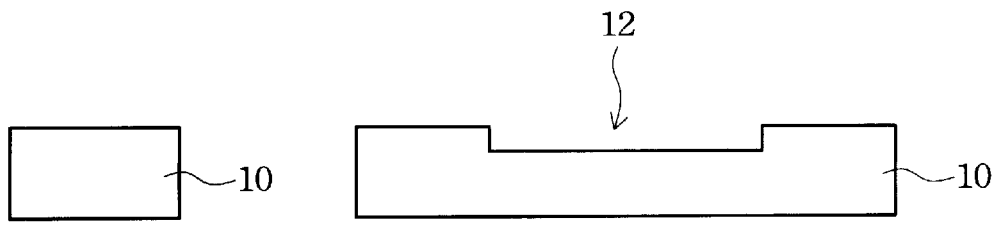
FIGS. 1–6 illustrate cross-sectional views of a conventional process, which comprising alignment area and element area, to fabricate a recess alignment-mark.
Figure 2:
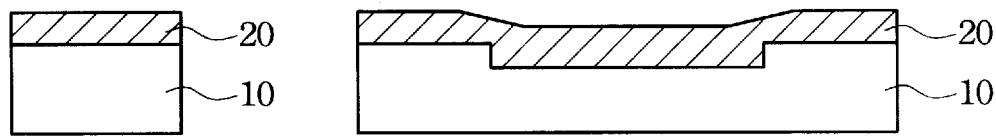
Figure 3:
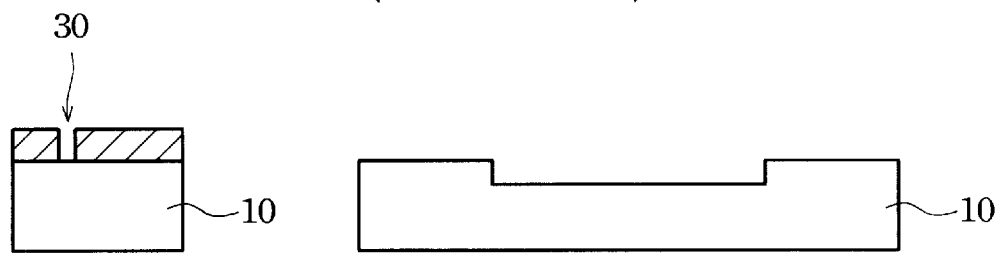
Figure 4:
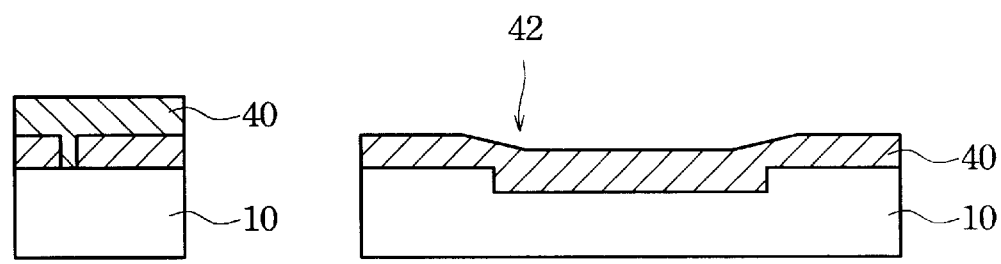
Figure 5:
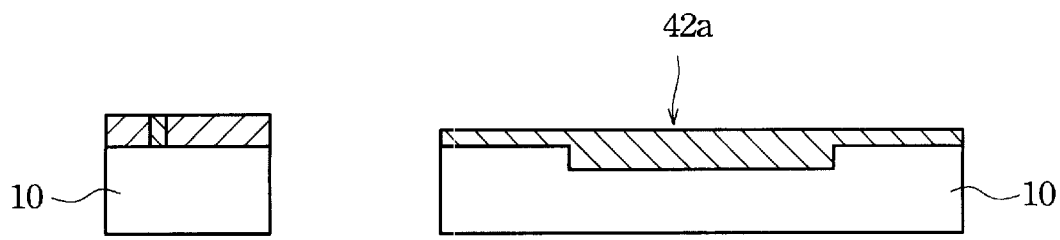
Figure 6:
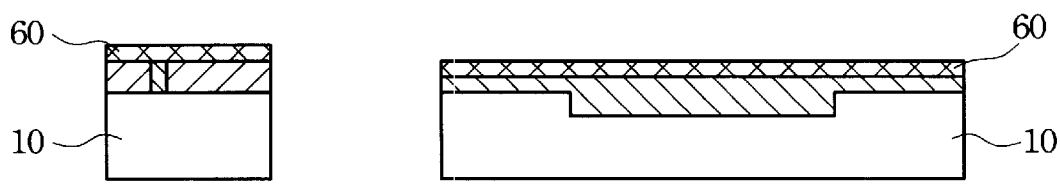
Figure 7:
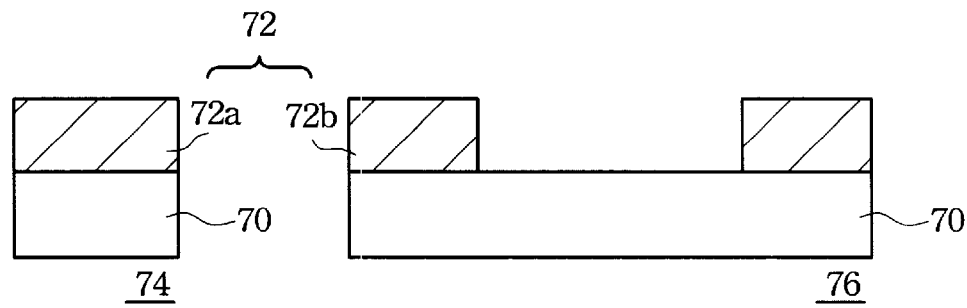
FIGS. 7–10 illustrate cross-sectional views of a process for fabricating a protrusive alignment-mark according to the present invention.

The present invention is directed to a method forming a protrusive alignment-mark to improve the drawbacks of the prior art wherein the protrusive alignment-mark acts as the adjustment of wafer position, layers alignment or a combination of both. Referring to FIG. 7, a photolithography process is performed on a substrate 70 to form patterned photoresist layer 72 wherein the substrate includes an element area 74 and an alignment area 76, and the patterned photoresist layer 72 contains an element photoresist-patterned area 72a and an alignment photoresist-patterned area 72b having a thickness between 2000 angstroms and 10000 angstroms, preferably a thickness of 0.56 $\mu$m.

Figure 8:
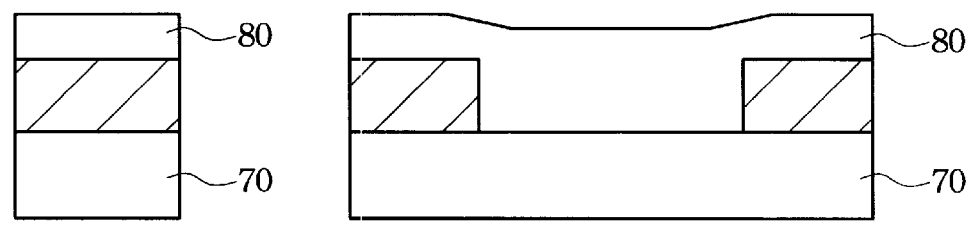

Referring to FIG. 8, a first dielectric layer 80 is formed on element photoresist-patterned area 72a and alignment photoresist-patterned area 72b. Then the top of first dielectric layer 80 exceeds that of the patterned photoresist layer 72 wherein the material of first dielectric layer 80 comprises silicon (Si), silicon oxide (SiOx), silicon nitride (Si3N4), borophosphosilicate (BPSG), spin-on glass (SOG) and the like. In the preferred embodiment of the present invention, fluid silicon oxide (SiOx) is formed by silane (SiH4) and ozone (O3), operated in the temperature between 0° C. and 160° C., preferably in 25° C., and followed by the drying process having the temperature between 90° C. and 110° C. In other words, the fluid silicon oxide (SiOx) mean that a first dielectric layer is liquefied for depositing the first dielectric layer on the element photoresist-patterned region and the alignment photoresist-patterned region.

Figure 9:
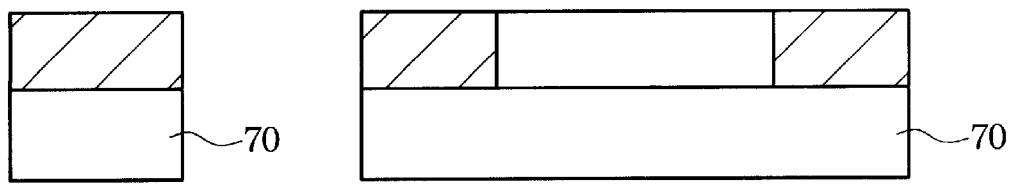

Referring to FIG. 9, the excess portion of first dielectric layer 80 above the photoresist layer 72 is coplanar with first dielectric layer 80 and thus the photoresist layer 72 is exposed. In the preferred embodiment of the present invention, an etch back is utilized to remove the first dielectric layer 80. For example, an wet etching process is used by buffer oxide etch (BOE) or hydrofluoric acid (HF), or an dry etching process is used by the mixed gas of $C_4F_8$, $CF_4$, $CHF_3$, $N_2$, Ar and CO.

Figure 10:
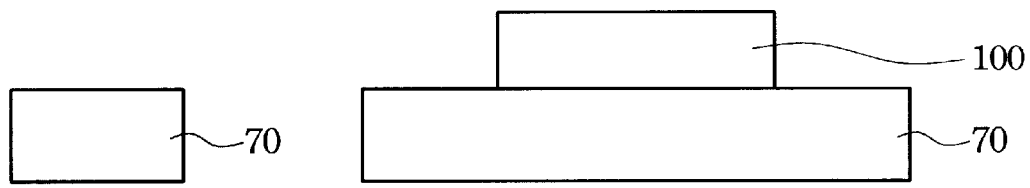

Referring to FIG. 10, after the patterned photoresist layer 72 on alignment area 76 and element area 74 is stripped away respectively, thereby a protrusive alignment-mark 100 is formed on alignment area 76. The removal of patterned photoresist layer 72, for example, make use of ashing by oxygen (O2). The protrusive alignment-mark 100 thickness is denoted as Dam, preferably 0.56 $\mu$m, which has an arbitrary profile.

Since the operation temperature of forming silicon oxide (SiOx) is extremely lower than that of the general photoresist, the patterned photoresist layer preserves consequently some preferred features. When the first dielectric layer 80 is deposited on the alignment photoresist-patterned layer 72b, the silicon oxide (SiOx) layer is filled onto alignment area 76 with fluid, such that the silicon oxide (SiOx) layer is uniformly dispersed on the alignment photoresist-patterned layer 72b. The thickness of alignment photoresist-patterned layer 72b is easily equal to that of the protrusive alignment-mark 100. As a result, if the thickness of the alignment photoresist-patterned layer 72b is exactly controlled, the protrusive alignment-mark 100 thickness may be achieved accurately for signal detection. Since the structure of the alignment-mark is protrusive in the present invention, it is not a need to deposit a thicker layer of dielectric layer on whole substrate 70, but only a little mount of dielectric layer is deposited on the alignment photoresist-patterned layer 72b to preferably form a protrusive alignment-mark 100.

Figure 11:
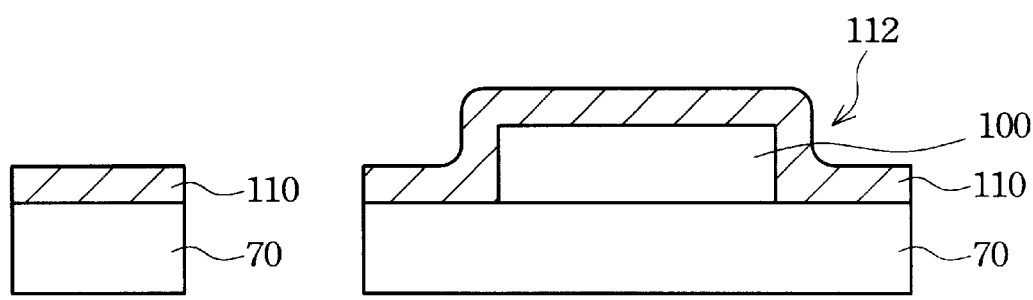
FIGS. 11–15 illustrate cross-sectional views including alignment area and element area of a process to fabricate a protrusive alignment-mark according to present invention.
Figure 12:
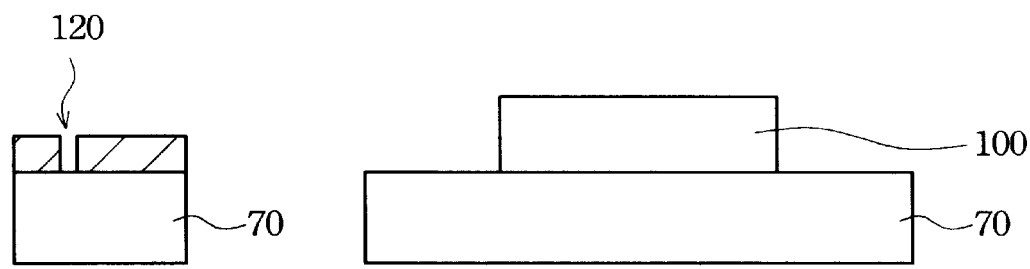
Figure 13:
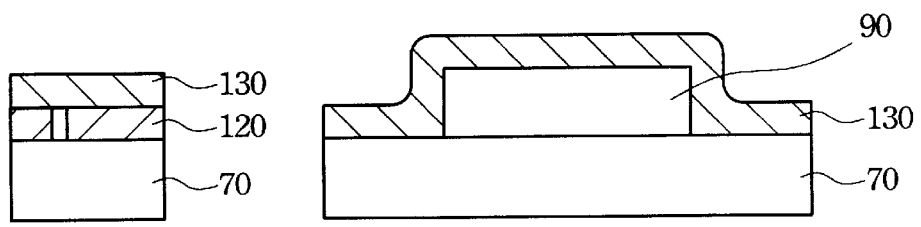

Referring to FIG. 11, a second dielectric layer 110 is formed on the protrusive alignment-mark 100 simultaneously retaining a step height 112 of the protrusive alignment-mark 100. For instance, borophosphosilicate (BPSG), having a thickness between 0.6 $\mu$m and 1.0 $\mu$m, is formed on the protrusive alignment-mark 100 and the element area 74 by using plasma-enhanced chemical vapor deposition (PECVD) process. Referring to FIG. 12, an etching process is carried out to remove borophosphosilicate (BPSG) on the protrusive alignment-mark 100 with respect to alignment area 76 and element area 74, and a contact hole 120 having a depth of 1 $\mu$m is etched on element area 74. Referring FIG. 13, a first conductive layer 130, having a thickness of $D_c$, is deposited on the protrusive alignment-mark 100 and the element area 74 wherein the thickness $D_c$, preferably 4000 $\mu$m, is tungsten plug.

Figure 14:
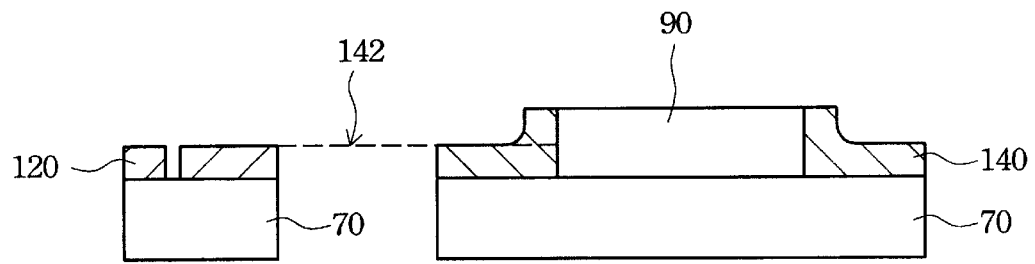
Figure 15:
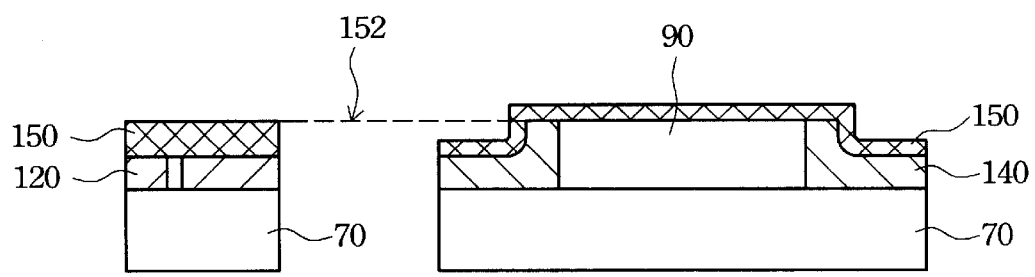

Referring FIG. 14, a planarization process is employed to planarize the element area 74 and retain the step height 112 of the protrusive alignment-mark all the time. For example, the rugged portion of the element area 74 is removed away by CMP process. When the tungsten layer on the element area 74 is removed and then the second dielectric layer 110 is exposed, a portion of tungsten layer is also subtracted away. Due to the sufficient thickness of the protrusive alignment-mark 100, the alignment area 76 is kept in a preferred step height for signal detection, and a tungsten plug is formed on element area 76. Referring to FIG. 15, a second conductive layer 150, such as an aluminum layer having a thickness of 4000 angstroms, is formed on the protrusive alignment-mark 100 and the element area 74 for multilevel interconnects.

In the preferred embodiment of the present invention, after the CMP process, if the thickness of said protrusive alignment-mark 100 is determined by $D_{am} \geq (S+D_c)$, then the stepper may generate the interference signals derived from the protrusive alignment-mark 100, wherein S is the step height 112 between 1200 angstroms and 1600 angstroms, and $D_c$ is the thickness of first conductive layer 130.

According to the above-mentioned, many advantages of protrusive alignment-mark 100 comprise (1) A sufficient thickness of protrusive alignment-mark 100 is formed by an effective semiconductor process. After a CMP process is employed, the protrusive alignment-mark 100 on the alignment area 74 has being kept a step height 112 for signal detection. (2) A protrusive alignment-mark 100 is suitable for mask ROM, DRAM, Flash RAM and logic devices in the alignment procedure of semiconductor process. (3) The desirable thickness of protrusive alignment-mark 100 is determined by the thickness of the photoresist layer 72. After forming a protrusive alignment-mark 100, the photoresist layer 72 can be removed away to prevent the element area 74 from contaminant.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for forming protrusive alignment-mark, comprising:

providing a substrate;

performing a photolithography process to form a patterned photoresist layer on said substrate wherein said substrate has an element region and an alignment region, and said patterned photoresist layer has an element photoresist-patterned region and an alignment photoresist-patterned region;

depositing a first dielectric layer on the element photoresist-patterned region and said alignment photoresist-patterned region;

removing the excess portion of said first dielectric layer above said patterned photoresist layer such that said patterned photoresist layer is coplanar with said first dielectric layer and thus said patterned photoresist layer is exposed;

stripping said patterned photoresist layer on the element region and said alignment region to form a protrusive alignment-mark on said alignment region;

forming a second dielectric layer on said protrusive alignment-mark and the element region for retaining a step height of said protrusive alignment-mark, wherein the thickness of said protrusive alignment-mark is determined by Dam$\geq$(S+Dc), which S is said step height and Dc is the thickness of said first conductive layer;

performing an etching process with respect to the element region and said alignment region to remove said second dielectric layer on said protrusive alignment-mark, and etching a contact hole on the element region;

forming a first conductive layer on said protrusive alignment-mark and the element region;

employing a planarization process to planarize the element region to retain said step height of said protrusive alignment-mark all the time; and forming a second conductive layer on said protrusive alignment-mark and the element region for multilevel interconnects.

2. The method of claim 1, wherein said protrusive alignment-mark is used for the adjustment of wafer position, layers alignment or a combination of both.

3. The method of claim 1, wherein depositing said first dielectric layer comprises the use of silane (SiH4) and ozone (O3) to form a silicon oxide (SiOx) layer.

4. The method of claim 3, wherein the temperature of forming said fluid silicon oxide ($SiO_x$) layer is between 0° C. and 160° C.

5. The method of claim 1, wherein said first dielectric layer is one selected from the group consisting of silicon (Si), silicon oxide (SiOx), silicon nitride (Si3N4), borophosphosilicate (BPSG) and spin-on glass (SOG).

6. The method of claim 1, wherein removing the excess portion of said first dielectric layer comprises etch back.

7. The method of claim 1, wherein the thickness of said alignment photoresist-patterned region is least 1000 angstroms.

8. The method of claim 1, wherein said step height has a thickness between 1200 angstroms and 1600 angstroms.

9. A method for forming protrusive alignment-mark, comprising:

providing a substrate;

performing a photolithography process to form a patterned photoresist layer on said substrate wherein said substrate has an element region and an alignment region, and said patterned photoresist layer has an element photoresist-patterned region and an alignment photoresist-patterned region;

liquefying a first dielectric layer for depositing said first dielectric layer on the element photoresist-patterned region and said alignment photoresist-patterned region such that said first dielectric layer is uniformly dispersed on said alignment photoresist-patterned region;

removing the excess portion of said first dielectric layer above said patterned photoresist layer such that said patterned photoresist layer is coplanar with said first dielectric layer and thus said patterned photoresist layer is exposed; and stripping said patterned photoresist layer on the element region and said alignment region to form a protrusive alignment-mark on said alignment region.

10. The method of claim 9, wherein said protrusive alignment-mark is used for the adjustment of wafer position, layers alignment or a combination of both.

11. The method of claim 9, wherein depositing said first dielectric layer comprises the use of silane (SiH4) and ozone (O3) to liquefy a silicon oxide (SiOx) layer on said alignment photoresist-patterned region.

12. The method of claim 11, wherein the temperature of forming said silicon oxide (SiOx) layer is between 0° C. and 160° C.

13. The method of claim 9, wherein said first dielectric layer is the one selected from one group consisting of silicon (Si), silicon oxide (SiOx), silicon nitride (Si3N4), borophosphosilicate (BPSG) and spin-on glass (SOG).

14. The method of claim 9, wherein removing the excess portion of said first dielectric layer comprises etch back.

15. The method of claim 9, wherein the thickness of said alignment photoresist-patterned layer is equal to the thickness of said protrusive alignment-mark for said step height properly.

16. The method of claim 15, wherein the thickness of said alignment photoresist-patterned region is at least 1000 angstroms.

17. The method of claim 15, wherein said step height is at least 1000 angstroms.

18. A method for forming protrusive alignment-mark having a step height, comprising:

performing a photolithography process to form a patterned photoresist layer on a substrate wherein said substrate has an element region and an alignment region, and said patterned photoresist layer has an element photoresist-patterned region and an alignment photoresist-patterned region;

depositing a first dielectric layer on the element photoresist-patterned region and said alignment photoresist-patterned region wherein said first dielectric layer comprises the use of silane (SiH4) and ozone (O3) to form a silicon oxide (SiOx) layer;

removing the excess portion of said first dielectric layer above said patterned photoresist layer such that said patterned photoresist layer is coplanar with said first dielectric layer and thus said patterned photoresist layer is exposed;

stripping said patterned photoresist layer on the element region and said alignment region to form a protrusive alignment-mark on said alignment region;

forming a second dielectric layer on said protrusive alignment-mark and the element region for retaining a step height of said protrusive alignment-mark, wherein the thickness of said protrusive alignment-mark is determined by Dam≧(S+Dc), which S is said step height and Dc is the thickness of said first conductive layer;

performing an etching process with respect to the element region and said alignment region to remove said second dielectric layer on said protrusive alignment-mark;

forming a first conductive layer on said protrusive alignment-mark and the element region; and employing a planarization process to planarize the element region to retain said step height of said protrusive alignment-mark all the time.

19. The method of claim 18, wherein said protrusive alignment-mark is used for the adjustment of wafer position, layers alignment or a combination of both.

20. The method of claim 18, wherein the temperature of forming said fluid silicon oxide ($SiO_x$) layer is between 0° C. and 160° C.

21. The method of claim 18, wherein said first dielectric layer is the one selected from one group consisting of silicon (Si), silicon oxide (SiOx), silicon nitride (Si3N4), borophosphilicate (BPSG) and spin-on glass (SOG).

22. The method of claim 18, wherein removing the excess portion of said first dielectric layer comprises etch back.

23. The method of claim 18, wherein the thickness of said alignment photoresist-patterned region is at least 1000 angstroms.

24. The method of claim 18, wherein said step height has a thickness between 1200 angstroms and 1600 angstroms.

25. The method of claim 18, wherein said step height is at least 1000 angstroms.

* * * * *